United States Patent
Liu et al.

(10) Patent No.: US 11,824,538 B2
(45) Date of Patent: Nov. 21, 2023

(54) MULTI-BIT FLIP FLOP

(71) Applicant: Taiwan Semiconductor Manufacturing Company, Ltd., Hsinchu (TW)

(72) Inventors: Chi-Lin Liu, Taipei (TW); Shang-Chih Hsieh, Yangmei (TW); Wei-Hsiang Ma, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/082,368

(22) Filed: Oct. 28, 2020

(65) Prior Publication Data

US 2021/0203311 A1     Jul. 1, 2021

Related U.S. Application Data

(60) Provisional application No. 62/954,987, filed on Dec. 30, 2019.

(51) Int. Cl.
*H03K 3/037* (2006.01)
*H03K 19/21* (2006.01)

(52) U.S. Cl.
CPC ............. *H03K 3/037* (2013.01); *H03K 19/21* (2013.01)

(58) Field of Classification Search
CPC ........ G11C 19/00; G11C 19/28; H03K 19/00; H03K 19/21; H03K 3/00; H03K 3/013; H03K 3/037; H03K 3/0375; H03K 3/286
USPC ........................................................ 327/225
See application file for complete search history.

(56) References Cited

U.S. PATENT DOCUMENTS

| | | | | |
|---|---|---|---|---|
| 6,822,478 | B2* | 11/2004 | Elappuparackal | G06F 1/04 326/46 |
| 2003/0006806 | A1* | 1/2003 | Elappuparackal | G06F 1/04 327/93 |
| 2013/0194016 | A1 | 8/2013 | Wimer | |
| 2016/0269002 | A1* | 9/2016 | Zhang | H03K 3/0372 |

\* cited by examiner

*Primary Examiner* — Daniel C Puentes
(74) *Attorney, Agent, or Firm* — Merchant & Gould P.C.

(57) ABSTRACT

A circuit includes a multi-bit flip flop, an integrated clock gating circuit connected to the multi-bit flip flop, and a control circuit connected to the integrated clock gating circuit and the multi-bit flip flop. The control circuit compares output data of the multi-bit flip flop corresponding to input data with the input data. The control circuit generates an enable signal based on comparing the output data of the multi-bit flip flop corresponding to the input data with the input data of the multi-bit flip flop. The control circuit provides the enable signal to the integrated clock gating circuit, wherein the integrated clock gating circuit provides, based on the enable signal, a clock signal to the multi-bit flip flop causing the multi-bit flip flop to toggle.

20 Claims, 6 Drawing Sheets

| Input | | Output |
|---|---|---|
| D1 | D1 | X1 |
| 0 | 0 | 0 |
| 0 | 1 | 1 |
| 1 | 0 | 1 |
| 1 | 1 | 0 |

| Input | | | | Output |
|---|---|---|---|---|
| X1 | X2 | X3 | X4 | En |
| (don' care) | (don' care) | (don' care) | 1 | 1 |
| (don' care) | (don' care) | 1 | (don' care) | 1 |
| 1(don' care) | 1 | (don' care) | (don' care) | 1 |
| 1 | (don' care) | (don' care) | (don' care) | 1 |
| 0 | 0 | 0 | 0 | 0 |

MULTI-BIT FLIP FLOP

CROSS REFERENCE TO RELATED APPLICATION

This application claims the benefit of U.S. Provisional Application No. 62/954,987, filed Dec. 30, 2019, and titled "Multi-Bit Flip Flop," the disclosure of which is hereby incorporated herein by reference.

BACKGROUND

A flip-flop is a circuit that has two stable states and thereby is capable of serving as one bit of memory. A flip-flop is usually controlled by one or two control signals and a clock signal. The output often includes the complement as well as the normal output. Flip-flops can be either simple (transparent) or clocked (or non-transparent). Clocked flip-flops are specially designed for synchronous (time-discrete) systems and typically implemented as master-slave devices. Flip-flops can be further divided into types: the RS ("set-reset"), D ("data" or "delay"), T ("toggle"), and JK types are common ones. The D flip-flop is known as a delay flip-flop (as its output Q looks like a delay of input D) or data latch. The behavior of a particular type flip-flop can be described by what is termed the characteristic equation, which derives the "present state" output in terms of the input signal(s) and/or the "previous state" signal of the flip-flops.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic Design Automation (EDA) tools and methods facilitate the design, partition, and placement of microelectronic integrated circuits on a semiconductor substrate. This process typically includes turning a behavioral description of the circuit into a functional description, which is then decomposed into logic functions and mapped into cells using a standard cell library. Once mapped, a synthesis is performed to turn the structural design into a physical layout, a clock tree is built to synchronize the structural elements, and the design is optimized post layout.

Figure 1:
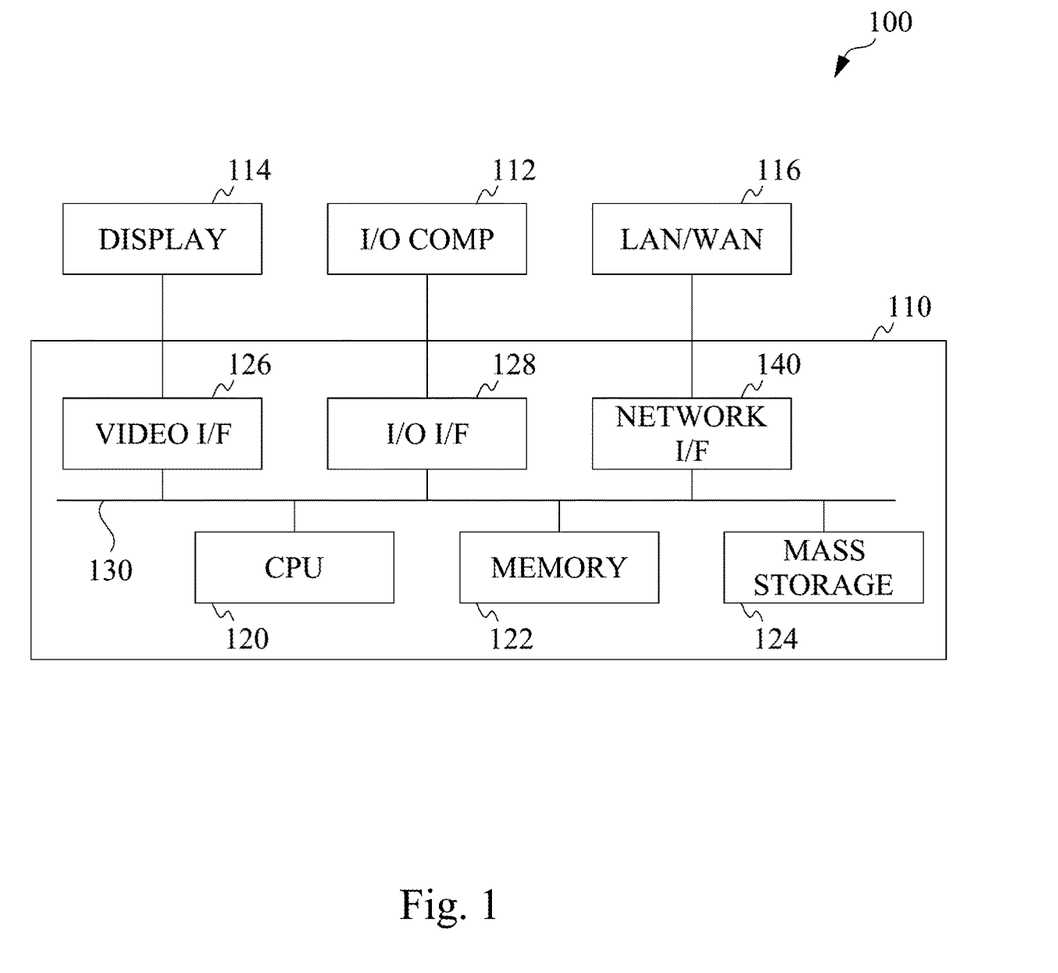
FIG. 1 is a block diagram illustrating an example of a processing system in accordance with some embodiments.

FIG. 1 is a block diagram illustrating an example of a processing system 100 in accordance with some embodiments disclosed herein. Processing system 100 may be used to perform a method for operating a multi-bit flip-flop in accordance with various processes discussed herein. Processing system 100 includes a processing unit 110, such as a desktop computer, a workstation, a laptop computer, a dedicated unit customized for a particular application, a smart phone or tablet, etc. Processing system 100 may be equipped with a display 114 and one or more input/output devices 112, such as a mouse, a keyboard, touchscreen, printer, etc. Processing unit 110 also includes a central processing unit (CPU) 120, memory 122, a mass storage device 124, a video adapter 126, and an I/O interface 128 connected to a bus 130.

Bus 130 may be one or more of any type of several bus architectures including a memory bus or memory controller, a peripheral bus, or video bus. CPU 120 may comprise any type of electronic data processor, and memory 122 may comprise any type of system memory, such as static random access memory (SRAM), dynamic random access memory (DRAM), or read-only memory (ROM).

Mass storage device 124 may comprise any type of storage device configured to store data, programs, and other information and to make the data, programs, and other information accessible via bus 130. Mass storage device 124 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. Memory 122 and mass storage device 124 are computer storage media examples (e.g., memory storage). Mass storage device 124 may further store a library of standard cells, as will be discussed further herein below.

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by processing system 100. Any such computer storage media may be part of processing system 100. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

Video adapter 126 and I/O interface 128 may provide interfaces to couple external input and output devices to processing unit 110. As illustrated in FIG. 1, examples of input and output devices include display 114 coupled to video adapter 126 and I/O device 112, such as a mouse, keyboard, printer, and the like, coupled to I/O interface 128. Other devices may be coupled to processing unit 110, and additional or fewer interface cards may be utilized. For example, a serial interface card (not shown) may be used to provide a serial interface for a printer. Processing unit 110 also may include a network interface 140 that may be a wired link to a local area network (LAN) or a wide area network (WAN) 116 and/or a wireless link.

Embodiments of processing system 100 may include other components. For example, processing system 100 may include power supplies, cables, a motherboard, removable storage media, cases, and the like. These other components, although not shown, are considered part of processing system 100.

In some examples, software code is executed by CPU 120 to operate a multi-bit flip-flop. The software code may be accessed by CPU 120 via bus 130 from memory 122, mass storage device 124, or the like, or remotely through network interface 140. Further, in some examples, a physical integrated circuit layout may be created based on a functional integrated circuit design, which may be received though I/O interface 128 and/or stored in memory 122 or mass storage device 124 in accordance with various methods and processes implemented by the software code.

A standard cell can include an entire device, such as a transistor, diode, capacitor, resistor, or inductor, or can include a group of several devices arranged to achieve some particular function, such as an inverter, a flip-flop, a memory cell, or an amplifier, among others. In addition to making functional design easier to conceptualize, the use of standard cells can reduce verification time for design rule checking (DRC) of the layout features within the IC, because a standard cell that is repeated throughout the layout can be checked a single time in DRC rather than each instantiation being checked individually. Based on the received functional circuit description, processing system 100 is configured to select standard cells from the cell library.

As noted above, flip-flop circuits may be included in a standard cell library. A flip-flop is a circuit that has two stable states and thereby is capable of serving as one bit of memory. A flip-flop is usually controlled by one or two control signals and a clock signal. The output often includes the complement as well as the normal output. Flip-flops can be either simple (transparent) or clocked (or non-transparent). Clocked flip-flops are specially designed for synchronous (time-discrete) systems and typically implemented as master-slave devices. Flip-flops can be further divided into types: the RS ("set-reset"), D ("data" or "delay"), T ("toggle"), and JK types are common ones. The D flip-flop is known as a delay flip-flop (as its output Q looks like a delay of input D) or data latch. The behavior of a particular type flip-flop can be described by what is termed the characteristic equation, which derives the "present state" output in terms of the input signal(s) and/or the "previous state" signal of the flip-flops.

The D flip-flop captures the value of the D-input at a definite portion of the clock cycle (such as the rising edge of the clock). That captured value becomes the Q output. At other times, the output Q does not change. The D flip-flop can be viewed as a memory cell, a zero-order hold, or a delay line.

Figure 2:
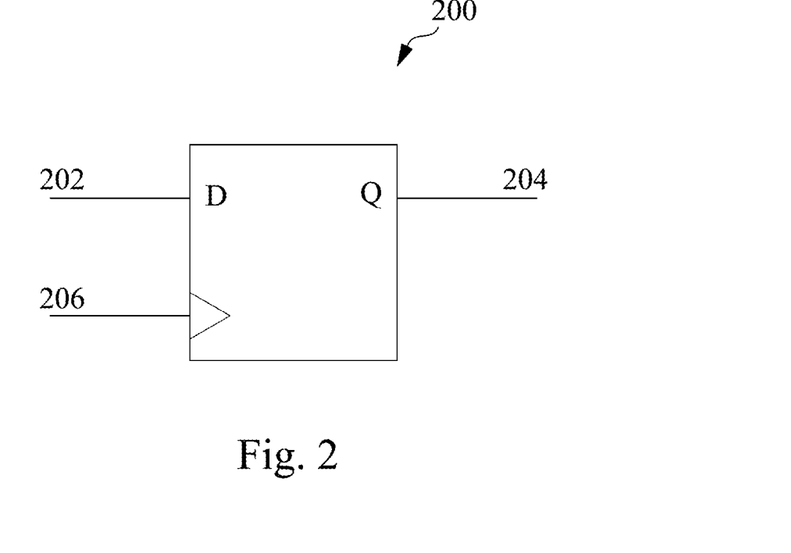
FIG. 2 depicts an example of a D-type flip-flop with a shared clock terminal and one output in accordance with some embodiments.

FIG. 2 depicts an example D-type flip flop 200 in accordance with aspects of the present disclosure. As shown in FIG. 2, flip flop 200 includes a data input terminal 202 and a data output terminal 204. In addition, flip flop 200 of FIG. 2 includes a clock input terminal, CK in, 206. Flip flop 200 captures a value, that is, input data, D, provided at data input terminal 202 at a definite portion of the clock cycle (such as the rising edge of the clock). That captured input data, D, becomes output data, Q, at data output terminal 204. At other times, the output data, Q does not change. In some examples, flip flop 200 can be viewed as a memory cell, a zero-order hold, or a delay line.

Multiple single bit flip flops, for example flip flop 200 of FIG. 2, are arranged to form multi-bit flip flops. Multi-bit flip flops have multiple input terminals and output terminals (D and Q pins). For instance, some two bit multi-bit flip-flops may have two input terminals and two output terminals (D0, D1, Q0, Q1 pins) along with a common clock, scan_in and scan_enable pins. In a two bit flip flop, the scan_in pin of a second bit flop is connected to a first flop Q pin (Q0), so that they are in scanning order. The layout of the multi-bit flip flop may be designed in a compact manner so that the effective area of the multi-bit flip flop is less than the added area of single-bit flip flops.

Known multi-bit flip flops may be employed to save power by sharing a local clock buffer among flip flops, optimizing power by reducing clock-toggling devices. Disclosed embodiments further save power by using a plurality of low clock pulse toggling single-bit flip flops and self-timed integrated clock gating (ICG) cells. In some examples, power is reduced by over 30%.

Figure 3:
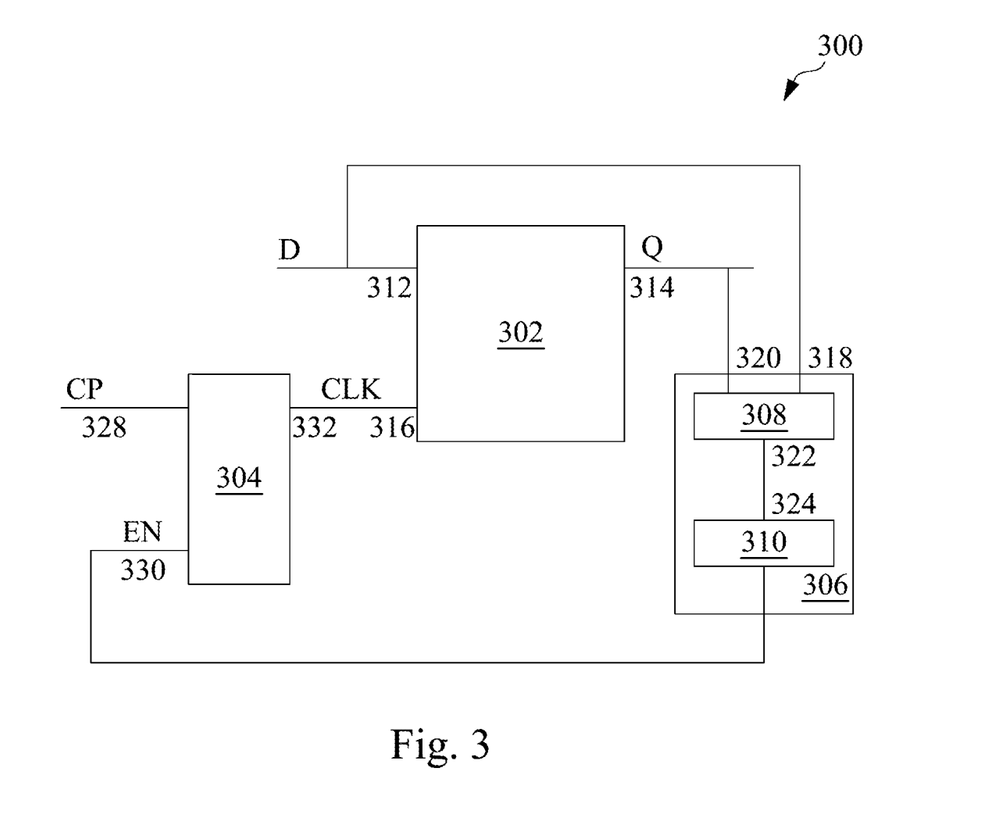
FIG. 3 depicts an example block diagram of a multi-bit flip-flop circuit in accordance with some embodiments.

FIG. 3 illustrates a block diagram of a multi-bit flip flop circuit 300 in accordance with some embodiments. As shown in FIG. 3, multi-bit flip flop circuit 300 includes multi-bit flip flop 302, an integrated clock gating circuit 304, and a control circuit 306. Multi-bit flip flop 302 is connected to both integrated clock gating circuit 304 and a control circuit 306. Control circuit 306 includes a disambiguation circuit 308 and a disjunction circuit 310. It will be apparent to a person with ordinary skill in the art after reading this disclosure that multi-bit flip flop circuit 300 can include more components than those depicted in FIG. 3.

As shown in FIG. 3, multi-bit flip flop 302 includes data input terminals 312, data output terminals 314, and clock input terminals 316. Multi-bit flip flop 302 captures input data, D<provided at data input terminals 312 and provides the captured input data, D, as output data, Q, at output terminals 314. Multi-bit flip flop 302 receives a clock signal, CLK, at clock input terminals 316 and toggles in response to receiving the clock signal, CLK. In some examples, multi-bit flip flops 302 includes a plurality of single bit flip flops arranged to form multi-bit flip flop 302 operative to temporarily store a pre-determined number of bits of data input. Multi-bit flip flops 302 is connected to control circuit 306.

Control circuit 306 includes first input terminals 318 and second input terminals 320. In some examples, disambiguation circuit 308 of control circuit 306 includes first input terminals 318 and second input terminals 320. First input terminals 318 are connected to input terminals 312 of multi-bit flip flop 302. Second input terminals 320 are connected to output terminals 314 of multi-bit flip flop 302. In some example, control circuit 306 compares the input data with the output data of multi-bit flip flop 302 corresponding to the input data, and provides an enable signal, EN, based on the comparison. Control circuit 306 provides the enable signal, EN at control circuit output terminal 326.

For example, disambiguation circuit 308 of control circuit 306 determines a logical disambiguation of the input data, D, and the output data, Q, of multi-bit flip flop 302 corresponding to the input data, D. Disambiguation circuit 308 provides results of the logical disambiguation determination at disambiguation circuit output terminals 322 of disambiguation circuit 308. Disambiguation circuit output terminals 322 are connected to disjunction circuit input terminals 324 of disjunction circuit 310. Hence, the results of the logical disambiguation determination of the input data, D, and the output data, Q, of multi-bit flip flop 302 corresponding to the input data, D, is provided as an input data to disjunction circuit 310.

Disjunction circuit 310 determines a logical disjunction of the results of logical disambiguation of the input data, D, and the output data, Q, of multi-bit flip flop 302 corresponding to the input data, D. Disjunction circuit 310 generates the enable signal, EN, based on the logical disjunction determination of the results of the logical disambiguation of the input data, D, and the output data, Q, of multi-bit flip flop 302 corresponding to the input data, D. Disjunction circuit 310 provides the enable signal, EN, as an output at disjunction circuit output terminal 326 which is also referred to as control circuit output terminal 326.

Disjunction circuit output terminal 326 or control circuit output terminal 326 is connected to a second input terminal 330 of integrated clock gating circuit 304. A first input terminal 328 of integrated clock gating circuit 304 is operative to receive a clock pulse, CP. Integrated clock gating circuit 304 generates the clock signal, CLK, at integrated clock gating circuit output terminal 332.

In some examples, integrated clock gating circuit 304 generates the clock signal, CLK, from the clock pulse, CP, based on the enable signal, EN. For example, integrated clock gating circuit 304 generates the clock signal, CLK, when the enable signal, EN, changes to a logic high. The clock signal, CLK, is provided at integrated clock gating circuit output terminal 332 which is connected to clock input terminal 316 of multi-bit flip flop 302. The clock signal, CLK, is provided to multi-bit flip flop 302 and toggles multi-bit flip flop 302.

Figure 4A:
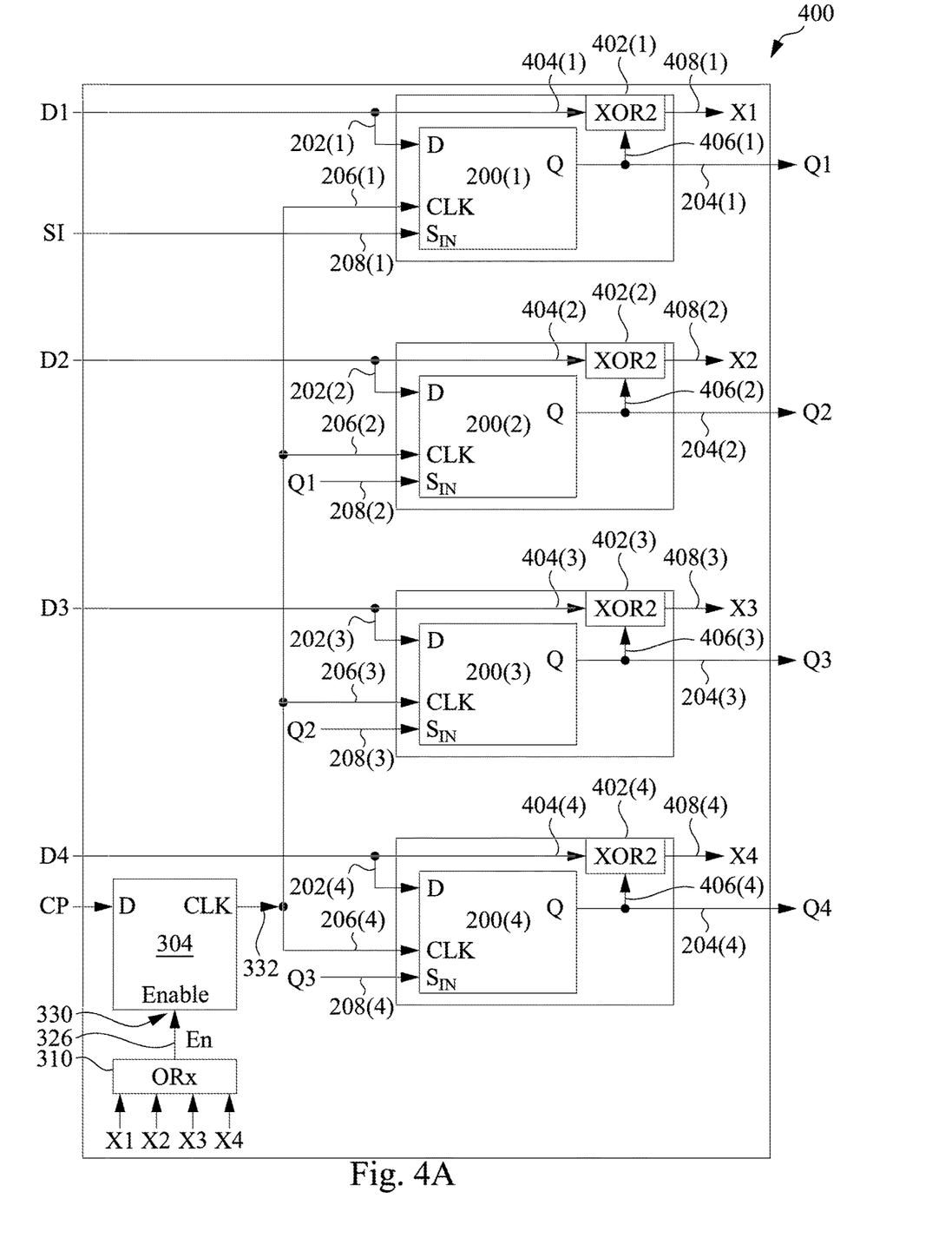
FIG. 4A depicts partial block diagram and partial circuit diagram of a multi-bit flip-flop circuit in accordance with some embodiments.

FIG. 4A depicts partial block diagram and partial circuit diagram of a multi-bit flip-flop circuit 400 in accordance with some embodiments. For example, and as shown in FIG. 4A, multi-bit flip-flop circuit 400 includes a plurality of single bit flop flops, for example, a first single bit flip flop 200(1), a second single bit flip flop 200(2), a third single bit flip flop 200(3), and a fourth single bit flip flop 200(4). In some examples, the plurality of single bit flip flops form multi-bit flip flop 302. Although, multi-bit flip-flop circuit 400 of FIG. 4A is shown to include only four single bit flip flops, it will be apparent to a person with an ordinary skill in the art after reading this disclosure that multi-bit flip flop circuit 400 may include a different number of single bit flip flops. For example, multi-bit flip flop circuit 400 may include two single bit flip flops, eight single bit flip flops, sixteen single bit flip flops, and so on.

In addition, multi-bit flip-flop circuit 400 includes a plurality of exclusive OR (XOR) logic circuits, for example, a first XOR logic circuit 402(1), a second XOR logic circuit 402(2), a third XOR logic circuit 402(3), and a fourth XOR logic circuit 402(4). In some examples, first XOR logic circuit 402(1), second XOR logic circuit 402(2), third XOR logic circuit 402(3), and fourth XOR logic circuit 402(4) form disambiguation circuit 308. Each of the plurality of XOR logic circuits is associated with one of the plurality of single bit flop flops. For example, first XOR logic circuit 402(1) is associated with first single bit flip flop 200(1), second XOR logic circuit 402(2) is associated with second single bit flip flop 200(2), third XOR logic circuit 402(3) is associated with third single bit flip flop 200(3), and fourth XOR logic circuit 402(4) is associated with fourth single bit flip flop 200(4). Thus, and in accordance with some embodiments, multi-bit flip flop circuit 400 includes a same number of or equal number of the plurality of XOR logic circuits and the plurality of single bit flop flops.

First single bit flip flop 200(1) includes a data input terminal 202(1), a data output terminal 204(1), and a clock input terminal 206(1). In addition, first single bit flip flop 200(1) includes a scan-in terminal 208(1). Data input terminal 202(1) of first single bit flip flop 200(1) is operative to receive first input data, D1. Clock input terminal 206(1) of first single bit flip flop 200(1) is connected to clock gating circuit output terminal 332 and is operative to receive the clock signal, CLK, from integrated clock gating circuit 304. Scan-in terminal 208(1) of first single bit flip flop 200(1) is operative to receive a scan input signal, SI.

First single bit flip flop 200(1) is operative to capture the first input data, D1, received at data input terminal 202(1) and provide the captured first input data, D1, as a first output data, Q1, at data output terminal 204(1). Data output terminal 204(1) of first single bit flip flop 200(1) is connected to a second input terminal 406(1) of first XOR logic circuit 402(1). A first input terminal 404(1) of first XOR logic circuit 402(1) is connected to data input terminal 202(1) of first single bit flip flop 200(1). Thus, first input terminal 404(1) of first XOR logic circuit 402(1) receives the first input data, D1, of first single bit flip flop 200(1) and second input terminal 406(1) of first XOR logic circuit 402(1) receives the first output data, Q1, of first single bit flip flop 200(1) corresponding to the first input data, D1.

Figure 4B:
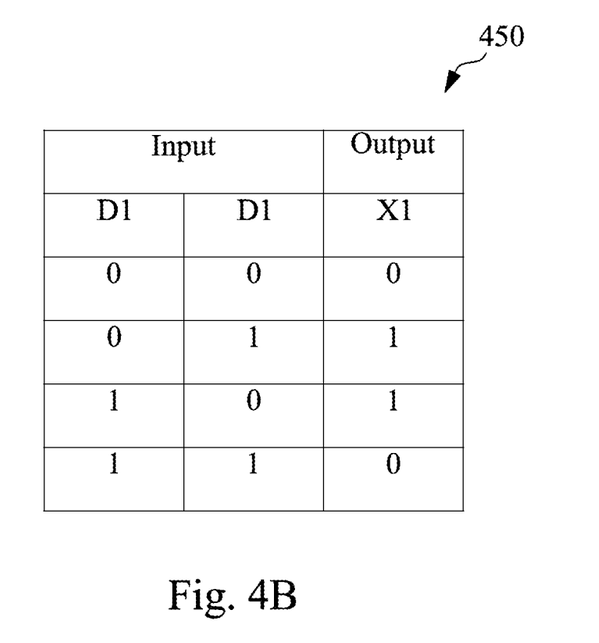
FIG. 4B depicts a truth table of an exclusive OR logic circuit of a multi-bit flip-flop circuit in accordance with some embodiments.

First XOR logic circuit 402(1) determines a logical disambiguation of the first input data, D1, of first single bit flip flop 200(1) and the first output data, Q1, of first single bit flip flop 200(1) corresponding to the first input data, D1. First XOR logic circuit 402(1) provides the first output data, X1, which is the logical disambiguation of the first input data, D1, of first single bit flip flop 200(1) and the first output data, Q1, of first single bit flip flop 200(1) corresponding to the first input data, D1, at output terminal 408(1). FIG. 4B illustrates an example truth table 450 of an example logical disambiguation of the first input data, D1, of first single bit flip flop 200(1) and the first output data, Q1, of first single bit flip flop 200(1) corresponding to the first input data, D1, in accordance with some embodiments.

As shown in FIG. 4B, truth table 450 includes columns for the first input data, D1, of first single bit flip flop 200(1), the first output data, Q1, of first single bit flip flop 200(1) corresponding to the first input data, D1, and the first output data, X1, of first XOR logic circuit 402(1). In some examples, the first output data, X1, of first XOR logic circuit 402(1) depends on the first input data, D1, of first single bit flip flop 200(1) and the first output data, Q1, of first single bit flip flop 200(1) corresponding to the first input data, D1. For example, when the first input data, D1, of first single bit flip flop 200(1) is a logical zero (0) and the first output data, Q1, of first single bit flip flop 200(1) corresponding to the first input data, D1, is a logical 0, then the first output data, X1, of first XOR logic circuit 402(1) is a logical 0.

By way of another example, when the first input data, D1, of first single bit flip flop 200(1) is a logical 0 and the first output data, Q1, of first single bit flip flop 200(1) corresponding to the first input data, D1, is a logical one (1), then the first output data, X1, is a logical 1. By way of yet another example, when the first input data, D1, of first single bit flip flop 200(1) is a logical 1 and the first output data, Q1, of first single bit flip flop 200(1) corresponding to the first input data, D1, is a logical 0, then the first output data, X1, of first XOR logic circuit 402(1) is a logical 1. By way of still another example, when the first input data, D1, of first single bit flip flop 200(1) is a logical 1 and the first output data, Q1, of first single bit flip flop 200(1) corresponding to the first input data, D1, is a logical 1, then the first output data, X1, of first XOR logic circuit 402(1) is a logical 0. Hence, first XOR logic circuit 402(1) provides the first output data, X1, of logical 1 when the first output data, Q1, of first single bit flip flop 200(1) corresponding to the first input data, D1, is different from the first input data, D1. Moreover, first XOR logic circuit 402(1) provides the first output data, X1, of logical 0 when the first output data, Q1, of first single bit flip flop 200(1) corresponding to the first input data, D1, is same as the first input data, D1.

Returning to FIG. 4A, second single bit flip flop 200(2) includes a data input terminal 202(2), a data output terminal 204(2), and a clock input terminal 206(2). In addition, second single bit flip flop 200(2) includes a scan-in terminal 208(2). Data input terminal 202(2) of second single bit flip flop 200(2) is operative to receive second input data, D2. Clock input terminal 206(2) of second single bit flip flop 200(2) is connected to clock gating circuit output terminal 332 and is operative to receive the clock signal, CLK, from integrated clock gating circuit 304. Scan-in terminal 208(2) of second single bit flip flop 200(2) is connected to output terminal 204(1) of first single bit flip flop 200(1) and is operative to receive the first output data, Q1, of first single bit flip flop 200(1).

Second single bit flip flop 200(2) is operative to capture the second input data, D2, received at data input terminal 202(2) and provide the captured second input data, D2, as a second output data, Q2, at data output terminal 204(2). Data output terminal 204(2) of second single bit flip flop 200(2) is connected to a second input terminal 406(2) of second XOR logic circuit 402(2). A first input terminal 404(2) of second XOR logic circuit 402(2) is connected to data input terminal 202(2) of second single bit flip flop 200(2). Thus, first input terminal 404(2) of second XOR logic circuit 402(2) receives the second input data, D2, of second single bit flip flop 200(2) and second input terminal 406(2) of second XOR logic circuit 402(2) receives the second output data, Q2, of second single bit flip flop 200(2) corresponding to the second input data, D2.

Second XOR logic circuit 402(2) determines a logical disambiguation of the second input data, D2, of second single bit flip flop 200(2) and the second output data, Q2, of second single bit flip flop 200(2) corresponding to the second input data, D2. Second XOR logic circuit 402(2) provides the second output data, X2, which is the logical disambiguation of the second input data, D2, of second single bit flip flop 200(2) and the second output data, Q2, of second single bit flip flop 200(2) corresponding to the second input data, D2, at output terminal 408(2). In examples, second XOR logic circuit 402(2) provides the second output data, X2, of logical 1 when the second output data, Q2, of second single bit flip flop 200(2) corresponding to the second input data, D2, is different from the second input data, D2. Moreover, second XOR logic circuit 402(2) provides the second output data, X2, of logical 0 when the second output data, Q2, of second single bit flip flop 200(2) corresponding to the second input data, D2, is same as the second input data, D2.

Continuing with FIG. 4A, third single bit flip flop 200(3) includes a data input terminal 202(3), a data output terminal 204(3), and a clock input terminal 206(3). In addition, third single bit flip flop 200(3) includes a scan-in terminal 208(3). Data input terminal 202(3) of third single bit flip flop 200(3) is operative to receive third input data, D3. Clock input terminal 206(3) of third single bit flip flop 200(3) is connected to clock gating circuit output terminal 332 and is operative to receive the clock signal from clock gating circuit 304. Scan-in terminal 208(3) of third single bit flip flop 200(3) is connected to output terminal 204(2) of second single bit flip flop 200(2) and is operative to receive the second output data, Q2, of second single bit flip flop 200(2).

Third single bit flip flop 200(3) is operative to capture the third input data, D3, received at data input terminal 202(3) and provide the captured third input data, D3, as a third output data, Q3, at data output terminal 204(3). Data output terminal 204(3) of third single bit flip flop 200(3) is connected to a second input terminal 406(3) of third XOR logic circuit 402(3). A first input terminal 404(3) of third XOR logic circuit 402(3) is connected to data input terminal 202(3) of third single bit flip flop 200(3). Thus, first input terminal 404(3) of third XOR logic circuit 402(3) receives the third input data, D3, of third single bit flip flop 200(3) and second input terminal 406(3) of third XOR logic circuit 402(3) receives the third output data, Q3, of third single bit flip flop 200(3) corresponding to the third input data, D3.

Third XOR logic circuit 402(3) determines a logical disambiguation of the third input data, D3, of third single bit flip flop 200(3) and the third output data, Q3, of third single bit flip flop 200(3) corresponding to the third input data, D3. Third XOR logic circuit 402(3) provides the third output data, X3, which is the logical disambiguation of the third input data, D3, of third single bit flip flop 200(3) and the third output data, Q3, of third single bit flip flop 200(3) corresponding to the third input data, D3, at output terminal 408(3). In examples, third XOR logic circuit 402(3) provides the third output data, X3, of logical 1 when the third output data, Q3, of third single bit flip flop 200(3) corresponding to the third input data, D3, is different from the third input data, D3. Moreover, third XOR logic circuit 402(3) provides the third output data, X3, of logical 0 when the third output data, Q3, of third single bit flip flop 200(3) corresponding to the third input data, D3, is same as the third input data, D3.

Still continuing with FIG. 4A, fourth single bit flip flop 200(4) includes a data input terminal 202(4), a data output terminal 204(4), and a clock input terminal 206(4). In addition, fourth single bit flip flop 200(4) includes a scan-in terminal 208(4). Data input terminal 202(4) of fourth single bit flip flop 200(4) is operative to receive fourth input data, D4. Clock input terminal 206(4) of fourth single bit flip flop 200(4) is connected to clock gating circuit output terminal 332 and is operative to receive the clock signal from clock gating circuit 304. Scan-in terminal 208(4) of fourth single bit flip flop 200(4) is connected to output terminal 204(3) of third single bit flip flop 200(3) and is operative to receive the third output data, Q3, of third single bit flip flop 200(3).

Fourth single bit flip flop 200(4) is operative to capture the fourth input data, D4, received at data input terminal 202(4) and provide the captured fourth input data, D4, as a fourth output data, Q4, at data output terminal 204(4). Data output terminal 204(4) of fourth single bit flip flop 200(4) is connected to a second input terminal 406(4) of fourth XOR logic circuit 402(4). A first input terminal 404(4) of fourth XOR logic circuit 402(4) is connected to data input terminal 202(4) of fourth single bit flip flop 200(4). Thus, first input terminal 404(4) of fourth XOR logic circuit 402(4) receives the fourth input data, D4, of fourth single bit flip flop 200(4) and second input terminal 406(4) of fourth XOR logic circuit 402(4) receives the fourth output data, Q4, of fourth single bit flip flop 200(4) corresponding to the fourth input data, D4.

Fourth XOR logic circuit 402(4) determines a logical disambiguation of the fourth input data, D4, of fourth single bit flip flop 200(4) and the fourth output data, Q4, of fourth single bit flip flop 200(4) corresponding to the fourth input data, D4. Fourth XOR logic circuit 402(4) provides the fourth output data, X4, which is the logical disambiguation of the fourth input data, D4, of fourth single bit flip flop 200(4) and the fourth output data, Q4, of fourth single bit flip flop 200(4) corresponding to the fourth input data, D4, at output terminal 408(4). In examples, fourth XOR logic circuit 402(4) provides the fourth output data, X4, of logical 1 when the fourth output data, Q4, of fourth single bit flip flop 200(4) corresponding to the fourth input data, D4, is different from the fourth input data, D4. Moreover, fourth XOR logic circuit 402(4) provides the fourth output data, X4, of logical 0 when the fourth output data, Q4, of fourth single bit flip flop 200(4) corresponding to the fourth input data, D4, is same as the fourth input data, D4.

Each of the first output data, X1, of first XOR logic circuit 402(1), the second output data, X2, of second XOR logic circuit 402(2), the third output data, X3, of third XOR logic circuit 402(3), and the fourth output data, X4, of fourth XOR logic circuit 402(4) are provided to disjunction circuit 310 of multi-bit flip flop circuit 400. For example, output terminal 408(1) of first XOR logic circuit 402(1) is connected to one of a plurality of input terminals of disjunction circuit 310. Moreover, output terminal 408(2) of second XOR logic circuit 402(2) is connected to another one of the plurality of input terminals of disjunction circuit 310. Furthermore, output terminal 408(3) of third XOR logic circuit 402(3) is connected to yet another one of the plurality of input terminals of disjunction circuit 310. In addition, output terminal 408(4) of fourth XOR logic circuit 402(4) is connected to yet another one of the plurality of input terminals of disjunction circuit 310.

Figure 4C:
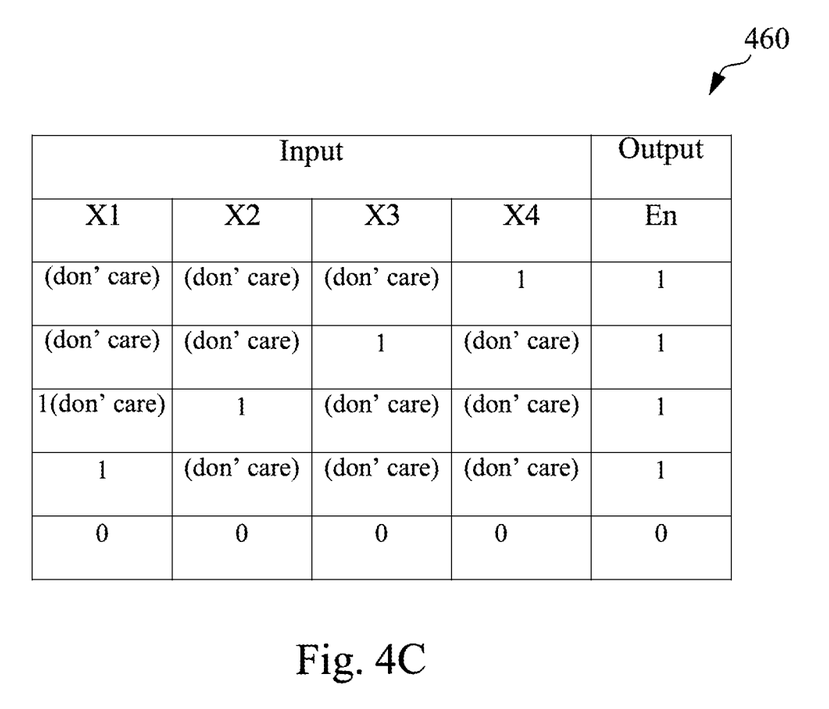
FIG. 4C depicts a truth table of a disjunction circuit of a multi-bit flip-flop circuit in accordance with some embodiments.

Disjunction circuit 310 determines a logical disjunction of the first output data, X1, of first XOR logic circuit 402(1), the second output data, X2, of second XOR logic circuit 402(2), the third output data, X3, of third XOR logic circuit 402(3), and the fourth output data, X4, of fourth XOR logic circuit 402(4) received at the plurality of input terminals of disjunction circuit 310 and generates the enable signal, EN, based on the logical disjunction. In some examples, disjunction circuit 310 is an OR logic circuit. FIG. 4C illustrates a truth table 460 of the logical disjunction of the first output data, X1, of first XOR logic circuit 402(1), the second output data, X2, of second XOR logic circuit 402(2), the third output data, X3, of third XOR logic circuit 402(3), and the fourth output data, X4, of fourth XOR logic circuit 402(4) received at the plurality of input terminals of disjunction circuit 310.

As shown in FIG. 4C, truth table 460 includes columns for the first output data, X1, of first XOR logic circuit 402(1), the second output data, X2, of second XOR logic circuit 402(2), the third output data, X3, of third XOR logic circuit 402(3), the fourth output data, X4, of fourth XOR logic circuit 402(4), and a logical value of the enable signal, EN. In some examples, the logical value of the enable signal, EN, depends on the first output data, X1, of first XOR logic circuit 402(1), the second output data, X2, of second XOR logic circuit 402(2), the third output data, X3, of third XOR logic circuit 402(3), and the fourth output data, X4, of fourth XOR logic circuit 402(4). For example, when the first output data, X1, of first XOR logic circuit 402(1) is a logical 0 or 1 (represented as don't care), the second output data, X2, of second XOR logic circuit 402(2) is a logical 0 or 1, the third output data, X3, of third XOR logic circuit 402(3) is a logical 0 or 1, and the fourth output data, X4, of fourth XOR logic circuit 402(4) is a logical 1, then the logical value of the enable signal, EN, is a logical 1.

By way of another example, when the first output data, X1, of first XOR logic circuit 402(1) is a logical 0 or 1, the second output data, X2, of second XOR logic circuit 402(2) is a logical 0 or 1, the third output data, X3, of third XOR logic circuit 402(3) is a logical 1, and the fourth output data, X4, of fourth XOR logic circuit 402(4) is a logical 0 or 1, then the logical value of the enable signal, EN, is a logical 1. By way of yet another example, when the first output data, X1, of first XOR logic circuit 402(1) is a logical 0 or 1, the second output data, X2, of second XOR logic circuit 402(2) is a logical 1, the third output data, X3, of third XOR logic circuit 402(3) is a logical 0 or 1, and the fourth output data, X4, of fourth XOR logic circuit 402(4) is a logical 0 or 1, then the logical value of the enable signal, EN, is a logical 1.

By way of yet another example, when the first output data, X1, of first XOR logic circuit 402(1) is a logical 1, the second output data, X2, of second XOR logic circuit 402(2) is a logical 0 or 1, the third output data, X3, of third XOR logic circuit 402(3) is a logical 0 or 1, and the fourth output data, X4, of fourth XOR logic circuit 402(4) is a logical 0 or 1, then the logical value of the enable signal, EN, is a logical 1. By way of yet another example, when the first output data, X1, of first XOR logic circuit 402(1) is a logical 0, the second output data, X2, of second XOR logic circuit 402(2) is a logical 0, the third output data, X3, of third XOR logic circuit 402(3) is a logical 0, and the fourth output data, X4, of fourth XOR logic circuit 402(4) is a logical 0, then the logical value of the enable signal, EN, is a logical 0.

Hence, the logical value of the enable signal, EN is logical 1 when any of the first output data, X1, of first XOR logic circuit 402(1), the second output data, X2, of second XOR logic circuit 402(2), the third output data, X3, of third XOR logic circuit 402(3), or the fourth output data, X4, of fourth XOR logic circuit 402(4) is a logical 1. That is, the logical value of the enable signal, EN is logical 1 when the output data, Q1 for any of first single bit flip flop 200(1), second single bit flip flop 200(2), third single bit flip flop 200(3), and fourth single bit flip flop 200(4) is different than the respective input data, D.

The enable signal, EN, is provided at disjunction circuit output terminal 326 which is connected to second input terminal 330 of integrated clock gating circuit 304. Thus, the enable signal, EN, is provided to integrated clock gating circuit 304. Integrated clock gating circuit 304 generates the clock signal at integrated clock gating circuit output terminal 332. For example, integrated clock gating circuit 304 provides the clock signal when the logical value of the enable signal, EN, is a logical 1. As discussed previously, the logical value of the enable signal, EN, is a logical 1 when the output data of one of the plurality of single bit flip flops of multi-bit flop circuit 400 is different than the input data of the one of the plurality of single bit flip flops from which the output data was captures.

Figure 5:
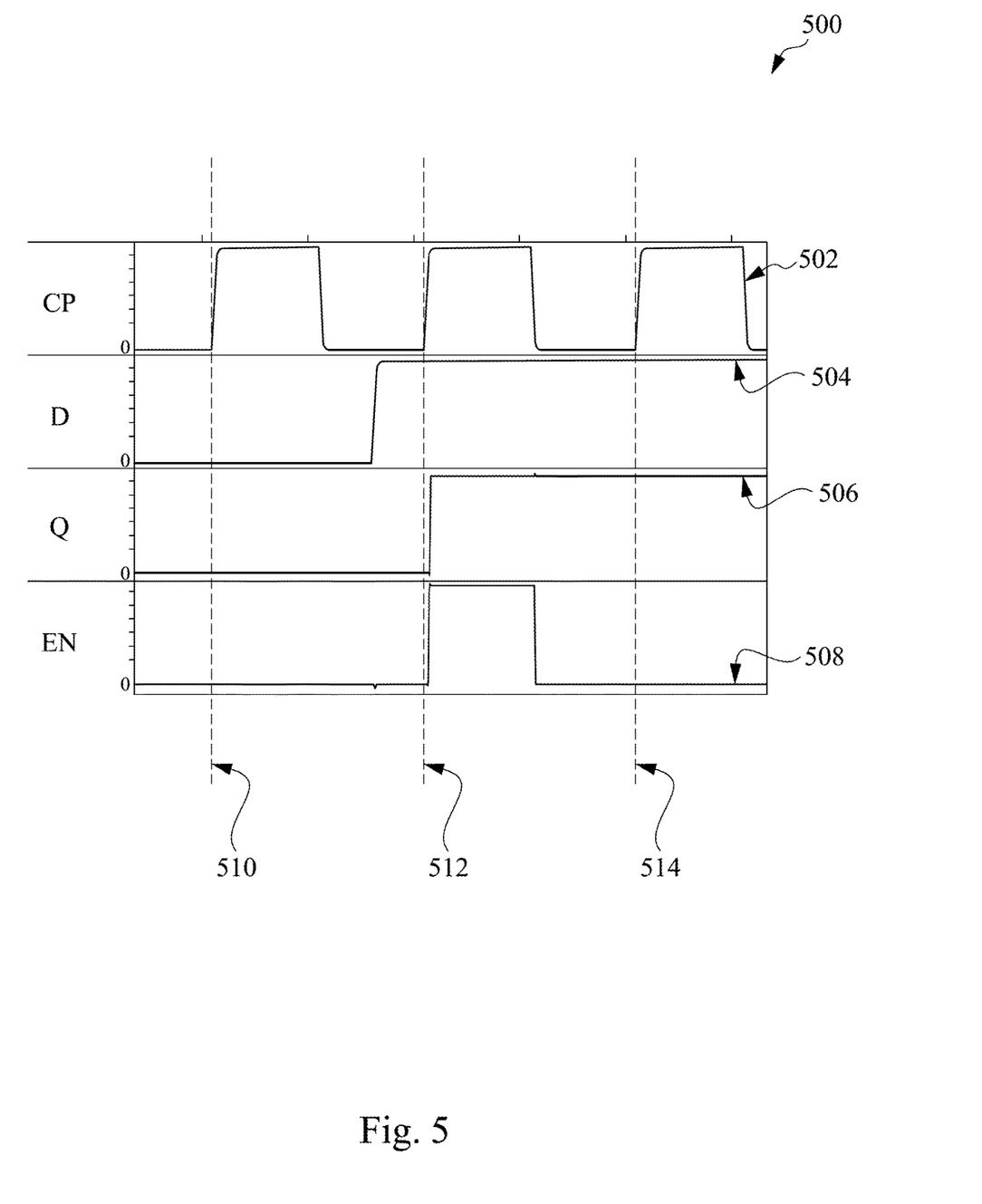
FIG. 5 is a block diagram showing an example of a multi-bit flip-flop constructed from two single bit flip-flop cells in accordance with some embodiments.

FIG. 5 is a graph 500 illustrating signals one of the plurality of single bit flip flops of multi-bit flip flop circuit 400 in accordance with some embodiments. For example, a first plot 502 of graph 500 is a representative of the clock pulse, CP of integrated clock gating circuit 304 of multi-bit flip flop circuit 400. Second plot 504 of graph 500 is a representative of the input data, D, of one of the plurality of single bit flip flops of multi-bit flip flop circuit 400. Third plot 506 of graph 500 is a representative of the output data, Q, of one of the plurality of single bit flip flops of multi-bit flip flop circuit 400 corresponding to the input data, D. Fourth plot 508 is a representative of the enable signal, EN.

As shown at first marker 510 when both the input data, D, and the output data, Q, are at a same logical value (that is logical 0), then the enable signal, EN, is also at a logical 0. However, as shown at second marker 512, when the input data, D, rises to logical 1 and the output data, Q, remains at logical 0, then the enable signal, EN, rises to logical 1. Furthermore, and as shown at third marker 514 when both the input data, D, and the output data, Q, are rises to logical 1, the enable signal, EN, is drops to logical zero.

Thus, and in accordance with example embodiments, integrated clock gating circuit generates the clock signal to toggle multi-bit flip flop 302 only when the output data of multi-bit flip flop 302 corresponding to an input data is different than the input data. This minimizes the clock pulse, CP and reduces a clock tree power. In addition, the disclosed processes results in less toggling of multi-bit flip flop 302 resulting in power saving. For example, the disclosed processes results in approximately 30.4% power saving at 10% data activity (that is, toggling) and approximately 64.3% power saving at 0% data activity.

Figure 6:
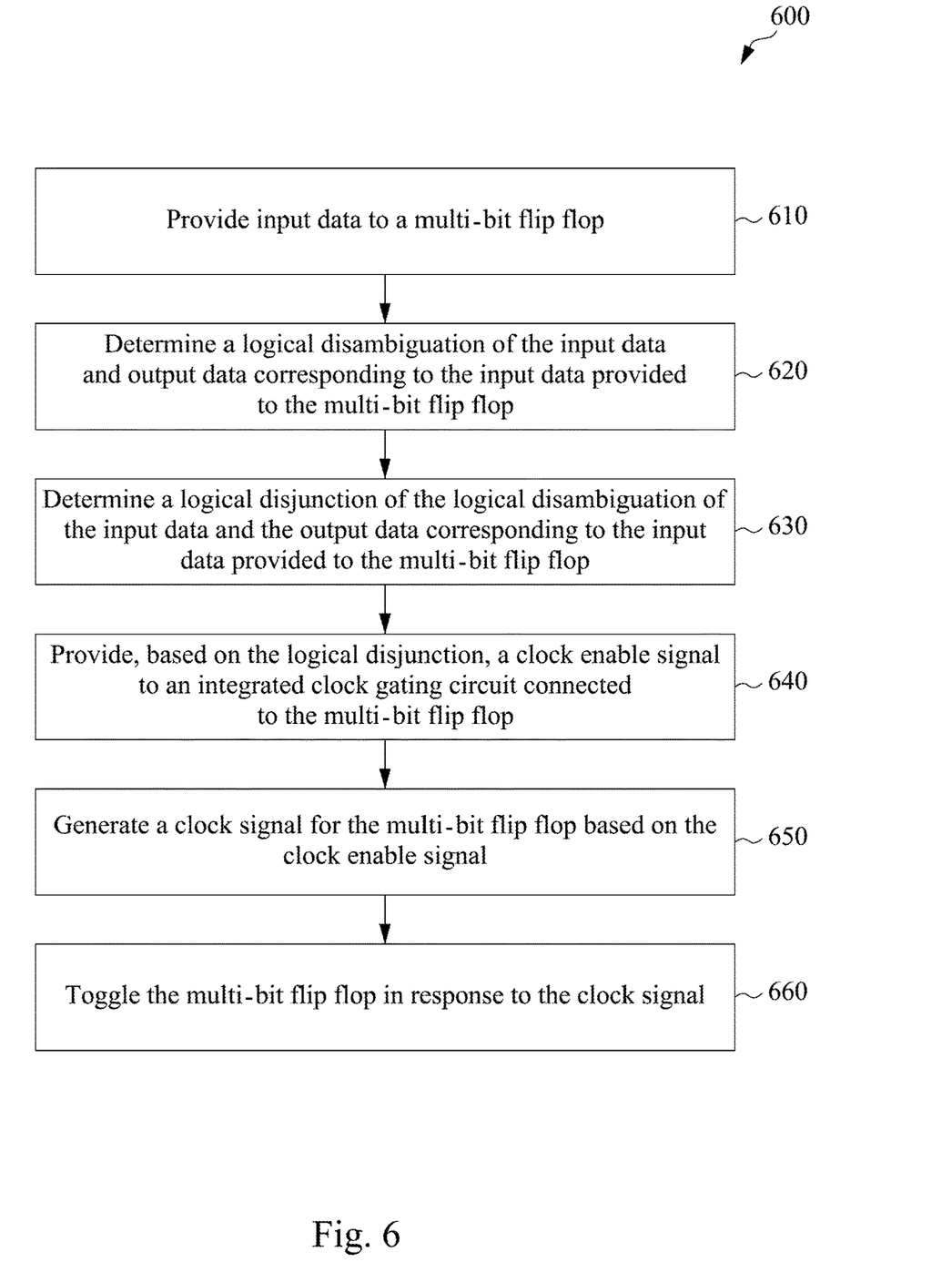
FIG. 6 is a flow diagram illustrating an example method for operating a multi-bit flip-flop in accordance with some embodiments.

FIG. 6, is a flow diagram of a method 600 for operating a multi-bit flip-flop in accordance with some embodiments. In some examples, method 600 is performed by processing system 100. In other embodiments, method 600 is stored as instructions on a non-transitory computer readable medium which when executed by processing unit 110 perform method 600.

At block 610 of method 600, input data is provided to a multi-bit flip-flop. For example, the input data is provided at input terminals 312 of multi-bit flip flop 302. Multi-bit flip flop 302 is operative to capture the input data and provide output data at output terminals 314. In some examples, the data input may include two bits, four bits, eight bits, etc. In some examples, both, the input data and output data corresponding to the input data of multi-bit flip-flop 302 is provided to disambiguation circuit 308.

At block 620 of method 600, a logical disambiguation of the input data and output data corresponding to the input data provided to the multi-bit flip-flop is determined. For example, disambiguation circuit 308 of multi-bit flip flop circuit 300 determines the logical disambiguation of the input data and output data corresponding to the input data provided to multi-bit flip-flop 302. The logical disambiguation of the input data and output data corresponding to the input data provided to multi-bit flip-flop 302 is provided to disjunction circuit 310.

At block 630 of method 600, a logical disjunction of the logical disambiguation of the input data and the output data corresponding to the input data provided to the multi-bit flip-flop is determined. For example, disjunction circuit 310 of multi-bit flip flop circuit 300 determines the logical disjunction of the logical disambiguation of the input data and output data corresponding to the input data provided to multi-bit flip-flop 302.

At block 640 of method 600, a enable signal is provided, based on the logical disjunction, to an integrated clock gating circuit connected to the multi-bit flip-flop. For example, the enable signal, EN, is provided to integrated clock gating circuit 304 connected to multi-bit flip flop 302. The enable signal, EN, is generated based on the logical disjunction of the logical disambiguation of the input data and output data corresponding to the input data provided to multi-bit flip-flop 302.

At block 650 of method 600, a clock signal for the multi-bit flip-flop is generated based on the enable signal. For example, integrated clock gating circuit 304 generates the clock signal based on the enable signal, EN from the clock pulse, CP. In some examples, the clock signal is provided to multi-bit flip flop 302 by integrated clock gating circuit 304. At block 660 of method 600, the multi-bit flip flop is toggled in response to the clock signal. For example, multi-bit flip flop 302 is toggled when the clock signal rises to a logic high, that is, logical 1.

In accordance with example embodiments, a circuit comprises: a multi-bit flip flop; an integrated clock gating circuit connected to the multi-bit flip flop; and a control circuit connected to the integrated clock gating circuit and the multi-bit flip flop, wherein the control circuit is operative to: compare output data of the multi-bit flip flop corresponding to input data with the input data, generate an enable signal based on comparing the output data of the multi-bit flip flop corresponding to the input data with the input data of the multi-bit flip flop, and provide the enable signal to the integrated clock gating circuit, wherein the integrated clock gating circuit provides, based on the enable signal, a clock signal to the multi-bit flip flop causing the multi-bit flip flop to toggle.

In example embodiments, a circuit comprises: a plurality of single bit flip flops; an integrated clock gating circuit, wherein an output terminal of the integrated clock gating circuit is connected to a clock input terminal of each of the plurality of single bit flip flops; a plurality of disambiguation logic circuits connected to the plurality of single bit flip flops, wherein each of the plurality of disambiguation logic circuits is operative to determine logical disambiguation of input data and output data corresponding to the input data for a corresponding single bit flip flop of the plurality of single bit flip flops; and a disjunction circuit connected to the plurality of disambiguation logic circuits, wherein disjunction circuit is operative to: determine logical disjunction of a plurality of outputs of the plurality of disambiguation logic circuits, and provide an enable signal based on the logical disjunction.

In accordance with example embodiments, a method comprises: providing input data to a multi-bit flip flop; determining a logical disambiguation of the input data and output data from the multi-bit flip flop corresponding to the input data; determining a logical disjunction of the logical disambiguation of the input data and the output data of the multi-bit flip flop corresponding to the input data; providing, based on the logical disjunction, an enable signal to an integrated clock gating circuit connected to the multi-bit flip flop; and generating, based on the enable signal, a clock signal for the multi-bit flip flop.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a multi-bit flip flop comprising a plurality of single bit flip flops;
an integrated clock gating circuit comprising an edge triggered flip flop having a data input terminal, an enable terminal, and an output terminal, wherein the data input terminal of the flip flop of the integrated clock gating circuit receives a clock pulse, and wherein the output terminal of the flip flop of the integrated clock gating circuit is connected directly to a clock input terminal of each single bit flip flop of the multi-bit flip flop; and
a control circuit comprising a plurality of exclusive OR (XOR) logic circuits and an OR logic circuit, wherein the OR logic circuit comprises a plurality of input terminals and an output terminal, wherein a first input terminal of each of the plurality of XOR logic circuits is connected to an input terminal of an associated single bit flip flop of the plurality of single bit flip flops and a second input terminal of each of the plurality of XOR logic circuits is connected to an output terminal of the associated single bit flip flop, wherein an output terminal of each of the plurality of XOR logic circuits is connected to one of the plurality of input terminals of the OR logic circuit, wherein the output terminal of the OR logic circuit is connected to the enable terminal of the flip flop of the integrated clock gating circuit, and wherein each of the plurality of XOR logic circuits of the control circuit is operative to:
determine a logical disjunction of output data of the associated single bit flip flop corresponding to input data and the input data, and
provide output data to one of the plurality of input terminals of the OR logic circuit based on the logical disjunction of the output data and the input data;
wherein the OR logic circuit is operative to:
generate an enable signal based on a logical disjunction of the output data of each of the plurality of XOR logic circuits, wherein the OR logic circuit being operative to generate the enable signal based on the logical disjunction of the output data of each of the plurality of XOR logic circuits comprises the OR logic circuit being operative to generate the enable signal having a first logic value when the output data corresponding to the input data of any of the plurality of single bit flip flops is different than the input data, and
provide the enable signal to the enable terminal of the flip flop of the integrated clock gating circuit; and
wherein the flip flop of the integrated clock gating circuit is operative to:
generate a clock signal from the clock pulse received at the data input terminal of the flip flop of the integrated clock gating circuit when the enable signal having the first logical value is received at the enable terminal of the flip flop of the integrated clock gating circuit, and
directly provide the clock signal to each single bit flip flop of the multi-bit flip flop causing the multi-bit flip flop to toggle.

2. The circuit of claim 1, wherein the control circuit comprises a disambiguation circuit comprising the plurality of XOR logic circuits and a disjunction circuit comprising the OR logic circuit.

3. The circuit of claim 1, wherein the multi-bit flip flop comprises eight single bit flip flops.

4. The circuit of claim 1, wherein each of the plurality of single bit flip flops comprises a D flip flop.

5. The circuit of claim 1, wherein the integrated clock gating circuit comprises a D flip flop.

6. The circuit of claim 1, wherein the flip flop of the integrated clock gating circuit being operative to generate the clock signal from the clock pulse received at the data input terminal of the flip flop when the enable signal having the first logical value is received at the enable terminal of the flip flop of the integrated clock gating circuit comprises the flip flop of the integrated clock gating circuit being operative to generate the clock signal from the clock pulse received at the data input terminal when the enable signal having a logic value high is received at the enable terminal of the flip flop of the integrated clock gating circuit.

7. The circuit of claim 1, wherein the first logic value comprises a logic value one.

8. A circuit comprising:
a plurality of single bit flip flops;
an integrated clock gating circuit comprising an edge triggered flip flop having a data input terminal, an enable terminal, and an output terminal, wherein the data input terminal of the flip flop of the integrated clock gating circuit receives a clock pulse, and wherein the output terminal of the flip flop of the integrated clock gating circuit is directly connected to a clock input terminal of each single bit flip flop of the plurality of single bit flip flops;
a plurality of disambiguation logic circuits, wherein each of the plurality of disambiguation logic circuits comprises a first input terminal, a second input terminal, and an output terminal, wherein the first input terminal of each of the plurality of disambiguation logic circuits is connected to an input terminal of an associated single bit flip flop of the plurality of single bit flip flops, wherein the second input terminal of each of the plurality of disambiguation logic circuits is connected to an output terminal of the associated single bit flip flop of the plurality of single bit flip flops, and wherein each of the plurality of disambiguation logic circuits is operative to determine logical disambiguation of input data and output data corresponding to the input data for the associated single bit flip flop of the plurality of single bit flip flops;

a disjunction logic circuit comprising a plurality of input terminals and an output terminal, wherein the output terminal of each of the plurality of disambiguation logic circuits is connected to one of the plurality of input terminals of the disjunction logic circuit, wherein the output terminal of the disjunction logic circuit is connected to the enable terminal of the integrated clock gating circuit, and wherein the disjunction logic circuit is operative to:

determine a logical disjunction of a plurality of outputs of the plurality of disambiguation logic circuits, generate an enable signal based on the logical disjunction of the plurality of outputs of the plurality of disambiguation logic circuits, wherein the disjunction logic circuit being operative to generate the enable signal based the logical disjunction of the plurality of outputs of the plurality of disambiguation logic circuits comprises the disjunction logic circuit being operative to generate the enable signal having a first logic value when the output data corresponding to the input data of any of the plurality of single bit flip flops is different than the input data, and provide the enable signal to the enable terminal of the integrated clock gating circuit; and wherein the integrated clock gating circuit is operative to:

generate a clock signal from the clock pulse received at the data input terminal and the enable signal having the first logical value is received at the enable terminal of the integrated clock gating circuit, and provide the clock signal to each single bit flip flop of the multi-bit flip flop.

9. The circuit of claim 8, wherein each of the plurality of disambiguation logic circuits comprises an exclusive OR (XOR) logic circuit.

10. The circuit of claim 8, wherein the plurality of single bit flip flops are toggled in response to the clock signal.

11. The circuit of claim 8, wherein the disjunction logic circuit comprises an OR logic circuit.

12. The circuit of claim 8, wherein each of the plurality of single bit flip flops comprises a D flip flop.

13. The circuit of claim 8, wherein the first logic value comprises a logic value one.

14. A method comprising:

providing input data to each of a plurality of single bit flop flops of a multi-bit flip flop;

determining, by each of a plurality of disambiguation logic circuits, a logical disambiguation of the input data and output data corresponding to the input data for each of the plurality of single bit flip flops, wherein each of the plurality of disambiguation logic circuits comprises a first input terminal, a second input terminal, and an output terminal, wherein the first input terminal of each of the plurality of disambiguation logic circuits is connected to an input terminal of an associated single bit flip flop of the plurality of single bit flip flops, wherein the second input terminal of each of the plurality of disambiguation logic circuits is connected to an output terminal of the associated single bit flip flop of the plurality of single bit flip flops;

determining, by a disjunction logic circuit, a logical disjunction of the logical disambiguation of the input data and the output data corresponding to the input data for each of the plurality of single bit flip flops, wherein the disjunction logic circuit comprises a plurality of input terminals and an output terminal, wherein the output terminal of each of the plurality of disambiguation logic circuits is connected to one of the plurality of input terminals of the disjunction logic circuit;

generating, by the disjunction logic circuit, an enable signal based on the logical disjunction of the logical disambiguation of the input data and the output data corresponding to the input data for each of the plurality of single bit flip flops, wherein generating the enable signal based on the logical disjunction of the logical disambiguation of the input data and the output data corresponding to the input data for each of the plurality of single bit flip flops comprises generating the enable signal having a first logical value when the output data corresponding to the input data of any of the plurality of single bit flip flops is different than the input data;

providing, by the disjunction logic circuit, the enable signal to an enable terminal of an edge triggered flip flop of an integrated clock gating circuit connected to the multi-bit flip flop, wherein the output terminal of the disjunction logic circuit is connected to the enable terminal of the flip flop of the integrated clock gating circuit; and generating, by the flip flop of the integrated clock gating circuit, a clock signal for the multi-bit flip flop from a clock pulse received at a data input terminal of the integrated clock gating circuit based on the enable signal having the first logical value received at the enable terminal.

15. The method of claim 14, further comprising toggling the multi bit flip flop in response to the clock signal.

16. The method of claim 14, further comprising toggling the multi-bit flip flop in response to the clock signal changing from a first logic value to a second logic value.

17. The method of claim 14, wherein generating, based on the enable signal having the first logical value, the clock signal for the multi-bit flip flop comprises generating the clock signal for the multi-bit flip flop when the enable signal is at a logic high.

18. The method of claim 14, wherein each of the plurality of disambiguation logic circuits comprises an exclusive OR (XOR) logic circuit.

19. The method of claim 14, wherein the disjunction logic circuit comprises an OR logic circuit.

20. The method of claim 14, further comprising providing the clock signal to each of the plurality of single bit flip flops, wherein an output terminal of the flip flop of the integrated clock gating circuit is connected to a clock input terminal of each of the plurality of single bit flip flops.

* * * * *